United States Patent
Balakrishnan et al.

(10) Patent No.: US 9,887,197 B2
(45) Date of Patent: Feb. 6, 2018

(54) STRUCTURE CONTAINING FIRST AND SECOND VERTICALLY STACKED NANOSHEETS HAVING DIFFERENT CRYSTALLOGRAPHIC ORIENTATIONS

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/257,073

(22) Filed: Sep. 6, 2016

(65) Prior Publication Data
US 2017/0179128 A1    Jun. 22, 2017

Related U.S. Application Data

(62) Division of application No. 14/975,727, filed on Dec. 19, 2015, now Pat. No. 9,472,555.

(51) Int. Cl.
| H01L 27/092 | (2006.01) |
| H01L 29/06 | (2006.01) |
| H01L 29/04 | (2006.01) |
| H01L 21/8238 | (2006.01) |

(52) U.S. Cl.
CPC .. *H01L 27/0924* (2013.01); *H01L 21/823821* (2013.01); *H01L 29/045* (2013.01); *H01L 29/0673* (2013.01)

(58) Field of Classification Search
CPC ......... H01L 27/0924; H01L 21/823821; H01L 29/045; H01L 29/0673
See application file for complete search history.

(56) References Cited

U.S. PATENT DOCUMENTS

| 6,864,520 B2 | 3/2005 | Fischetti et al. |
| 7,208,815 B2 | 4/2007 | Chen et al. |
| 7,432,149 B2 | 10/2008 | Wu et al. |

(Continued)

OTHER PUBLICATIONS

You, X. et al., "An electrochemical route to MoS2 nanosheets for device applications" Materials Letters, Apr. 2014, pp. 31-35.

(Continued)

*Primary Examiner* — Bilkis Jahan
(74) *Attorney, Agent, or Firm* — Scully, Scott, Murphy & Presser, P.C.; Louis J. Percello, Esq.

(57) ABSTRACT

A semiconductor structure is provided that includes a substrate comprising a first semiconductor material having a first crystallographic orientation and a first device region and a second device region. First vertically stacked and suspended nanosheets of semiconductor channel material of the first crystallographic orientation are located above the substrate and within the first device region. Second vertically stacked and suspended nanosheets of semiconductor channel material of a second crystallographic orientation are located above the substrate and within the second device region. In accordance with the present application, the second crystallographic orientation is different from the first crystallographic orientation.

18 Claims, 9 Drawing Sheets

(56) References Cited

U.S. PATENT DOCUMENTS

| | | |
|---|---|---|
| 7,977,712 B2 | 7/2011 | Zhu et al. |
| 8,940,578 B2 | 1/2015 | Facchetti et al. |
| 9,224,808 B2 | 12/2015 | Cea et al. |
| 2006/0046391 A1* | 3/2006 | Tang ................. H01L 27/10876 438/268 |
| 2009/0008705 A1* | 1/2009 | Zhu .................. H01L 29/66795 257/327 |
| 2011/0133167 A1* | 6/2011 | Bangsaruntip ......... B82Y 10/00 257/24 |
| 2013/0026451 A1* | 1/2013 | Bangsaruntip .... H01L 29/66439 257/24 |
| 2013/0105897 A1* | 5/2013 | Bangsaruntip ......... B82Y 10/00 257/351 |
| 2014/0021538 A1* | 1/2014 | Bangsaruntip .... H01L 29/66795 257/331 |
| 2014/0151639 A1* | 6/2014 | Chang ............... H01L 29/42392 257/27 |
| 2014/0339611 A1 | 11/2014 | Leobandung |
| 2015/0123215 A1 | 5/2015 | Obradovic et al. |
| 2015/0270349 A1* | 9/2015 | Cheng .................. H01L 29/161 257/9 |
| 2015/0303303 A1* | 10/2015 | Lauer ................. H01L 29/1054 257/347 |

OTHER PUBLICATIONS

Li, H. et al., "Mechanical Exfoliation and Characterization of Single- and Few-Layer Nanosheets of WSe2, TaS2, and TaSe2" Small 2013, 9, No. 11, pp. 1974-1981.

List of IBM Patents or Patent Applications Treated as Related, dated Sep. 6, 2016, 2 pages.

* cited by examiner

STRUCTURE CONTAINING FIRST AND SECOND VERTICALLY STACKED NANOSHEETS HAVING DIFFERENT CRYSTALLOGRAPHIC ORIENTATIONS

BACKGROUND

The present application relates to a method of forming a semiconductor structure containing vertically stacked and suspended nanosheets of a semiconductor channel material of a first crystallographic orientation in a first device region, and vertically stacked and suspended nanosheets of a semiconductor channel material of a second crystallographic orientation, different from the first crystallographic orientation, in a second device region. The present application also relates to the semiconductor structure that is provided by the method.

The use of new semiconductor devices such as, for example, semiconductor fin field effect transistors (FinFETs) is the next step in the evolution of complementary metal oxide semiconductor (CMOS) devices. One type of new semiconductor device that has been touted as a viable option beyond the 7 nm technology node is nanosheet containing devices. By "nanosheet containing devices" it is meant that the device channel contains one or more layers of nanosheets. Each nanosheet has a vertical thickness that is substantially less than the width of each nanosheet. Gate structures are formed above and below each nanosheet. One of the challenges facing the fabrication of nanosheet containing devices is to boost carrier mobility to improve device performance.

SUMMARY

In one aspect of the present application, a method of forming a semiconductor structure is provided. In one embodiment of the present application, the method includes providing a first substrate comprising a first semiconductor material having a first crystallographic orientation, wherein a second substrate portion comprising a second semiconductor material having a second crystallographic orientation that is different from the first crystallographic orientation is present on a portion of the first substrate. Next, a first nanosheet stack structure is formed on a portion of the first substrate and in a first device region, and a second nanosheet stack structure is formed on a portion of the second substrate portion and in a second device region. The first nanosheet stack structure comprises a first portion of a base sacrificial layer and alternating layers of semiconductor channel material and sacrificial semiconductor material, each of which has the first crystallographic orientation. The second nanosheet stack structure comprises a second portion of the base sacrificial layer, and alternating layers of semiconductor channel material and sacrificial semiconductor material, each of which has the second crystallographic orientation. A first sacrificial gate structure is formed straddling the first nanosheet stack structure and a second sacrificial gate structure is formed straddling the second nanosheet stack structure. Exposed portions of the first and second nanosheet stack structures are then removed and thereafter the first and second sacrificial gate structures are removed. Next, remaining portions of the base sacrificial layer and the layers of sacrificial semiconductor material are removed providing vertically stacked and suspended nanosheets of the semiconductor channel material in the first and second device regions, wherein the nanosheets of the semiconductor channel material in the first device region have the first crystallographic orientation and the nanosheets of the semiconductor channel material in the second device region have the second crystallographic orientation.

In another aspect of the present application, a semiconductor structure is provided. In one embodiment of the present application, the semiconductor structure includes a substrate comprising a first semiconductor material having a first crystallographic orientation and a first device region and a second device region. First vertically stacked and suspended nanosheets of semiconductor channel material of the first crystallographic orientation are located above the substrate and within the first device region. Second vertically stacked and suspended nanosheets of semiconductor channel material of a second crystallographic orientation are located above the substrate and within the second device region. In accordance with the present application, the second crystallographic orientation is different from the first crystallographic orientation.

DETAILED DESCRIPTION

Figure 1:
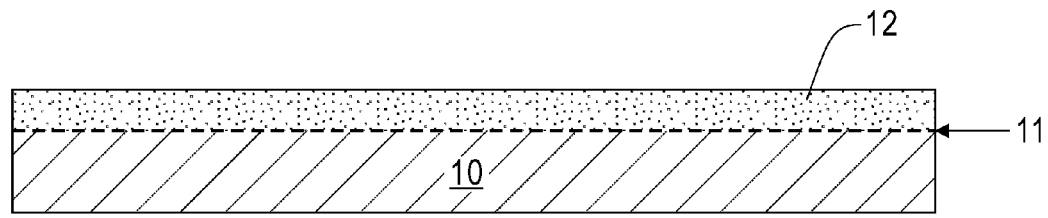
FIG. 1 is a cross sectional view of an exemplary semiconductor structure including a multilayered stack of, from bottom to top, a first substrate comprising a first semiconductor material having a first crystallographic orientation and a second substrate comprising a second semiconductor material having a second crystallographic orientation that is different from the first crystallographic orientation.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including a multilayered stack of, from bottom to top, a first substrate 10 comprising a first semiconductor material having a first crystallographic orientation and a second substrate 12 comprising a second semiconductor material having a second crystallographic orientation that is different from the first crystallographic orientation. The multilayered stack of the first substrate 10 and the second substrate 12 may be referred to herein as a hybrid orientation substrate.

In one embodiment of the present application, element 11 can be a bonding interface that is formed by the direct bonding of the first and second substrates (10, 12). In another embodiment of the present application, element 11 can be a dielectric layer such as, for example, an oxide. In such an embodiment, the dielectric layer may be present on at least one of the first and second substrates (10, 12) prior to bonding the first and second substrates (10, 12).

The first semiconductor material that provides the first substrate 10 may be any semiconductor material having semiconducting properties. Examples of semiconductor materials that may be used as the first semiconductor material and thus the first substrate 10 can include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one embodiment, the first semiconductor material that provides the first substrate 10 is silicon.

The first crystallographic orientation of the first semiconductor material that provides the first substrate 10 may be any of the well known crystallographic orientations. For example, the first crystallographic orientation of the first semiconductor material that provides the first substrate 10 may be {100}, {110}, or {111}. In one embodiment of the present application, the first substrate 10 is silicon having a {100} crystallographic orientation. In another embodiment of the present application, the first substrate 10 is silicon having a {110} crystallographic orientation.

The second semiconductor material that provides the second substrate 12 may include one of the semiconductor materials mentioned above for the first semiconductor material that provides the first substrate 10. In one embodiment, the second semiconductor material may be the same as the first semiconductor material. For example, silicon may be used as the first and second semiconductor materials. In another embodiment, the second semiconductor material may be different than the first semiconductor material. For example, the first semiconductor material may be composed of silicon, while the second semiconductor material may be composed of germanium.

The second crystallographic orientation of the second semiconductor material that provides the second substrate 12 may also be any of the well known crystallographic orientations provided that the second crystallographic orientation differs from the first crystallographic orientation. In one example, the first crystallographic orientation of the first semiconductor material that provides the first substrate 10 may be {100}, while the second crystallographic orientation of the second semiconductor material that provides the second substrate 12 may be {110}. In another example, the first crystallographic orientation of the first semiconductor material that provides the first substrate 10 may be {110}, while the second crystallographic orientation of the second semiconductor material that provides the second substrate 12 may be {100}. In either example, the first and second semiconductor materials may both be composed of silicon.

In some embodiments of the present application, the first substrate 10 and the second substrate 12 are both relaxed substrates. In another embodiment, the first substrate 10 is a relaxed substrate, while the second substrate 12 is strained.

The exemplary semiconductor structure illustrated in FIG. 1 can be formed utilizing any well known wafer bonding process. In some embodiments, wafer bonding may be performed at a temperature from 20° to 200° C. Other temperatures that are lesser than, or greater than, the aforementioned temperature range may also be employed in the present application to bond the first and second substrates (10, 12). In some embodiments of the present application, an external force may be applied to at least one of the two substrates during at least a portion of the bonding process. In some embodiments, at least one of the two substrates may be thinned after the bonding process. In one example, chemical mechanical polishing and/or grinding may be used to thin at least one of the two substrates after bonding.

Figure 2:
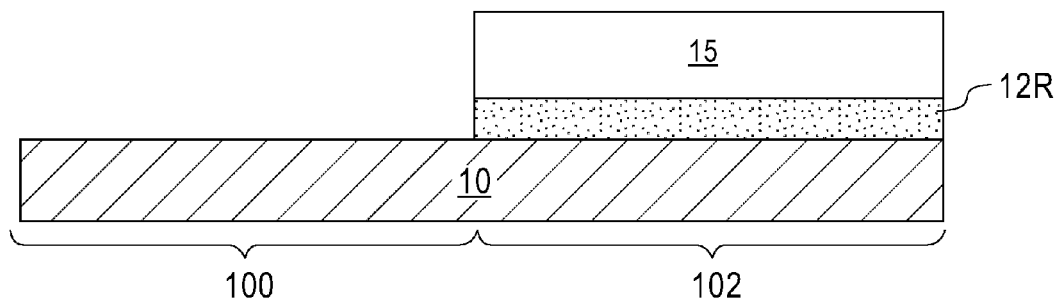
FIG. 2 is a cross sectional view of the exemplary semiconductor structure of FIG. 1 after forming a mask over a second device region and removing the second substrate from a first device region.

Referring now to FIG. 2, there is illustrated the exemplary semiconductor structure of FIG. 1 after forming a mask 15 over a second device region 102 and removing the second substrate 12 from a first device region 100. As shown, a portion of the second substrate 12 that is present directly beneath the mask 15 remains in the second device region 102. The portion of the second substrate 12 that remains in the second device region 102 can be referred to herein as a second substrate portion 12R.

In accordance with the present application, the first device region 100 is an area in which a first conductivity type semiconductor device can be subsequently formed, while the second device region 102 is an area in which a second conductivity type semiconductor device, that is opposite from the first conductivity type, can be subsequently formed. In one example, the first device region 100 is an area in which an n-type semiconductor device (e.g., nFET) can be subsequently formed, while the second device region 102 is an area in which a p-type semiconductor device (e.g., pFET) can be subsequently formed. In another example, the first device region 100 is an area in which a p-type semiconductor device (e.g., pFET) can be subsequently formed, while the second device region 102 is an area in which an n-type semiconductor device (e.g., nFET) can be subsequently formed.

The exemplary semiconductor structure of FIG. 2 can be formed by first providing a layer of at least one masking material over the entirety of the second substrate 12. In one embodiment, the masking material may include a hard mask material such as, for example, a semiconductor oxide, semiconductor nitride and/or semiconductor oxynitride. In one specific example, silicon dioxide can be used as the masking material.

In some embodiments, the layer of at least one masking material may be formed by a deposition process such as, for example, chemical vapor deposition or plasma enhanced chemical vapor deposition. In another embodiment, the layer of at least one masking material may be formed by a thermal growth process such as, for example, thermal oxidation or thermal nitridation. In yet another embodiment, any combination of deposition processes and/or thermal growth processes may be used in providing the layer of at least one masking material. The layer of at least one masking material may have a thickness from 20 nm to 100 nm. Other thickness that are lesser than, or greater than, the aforementioned thickness range may be also employed.

After providing the layer of the at least one masking material, the layer of at least one masking material is then patterned to provide mask 15 shown in FIG. 2. In one embodiment, patterning may be achieved by lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. In the present application, the etch stops on a surface of the first substrate 10.

Figure 3:
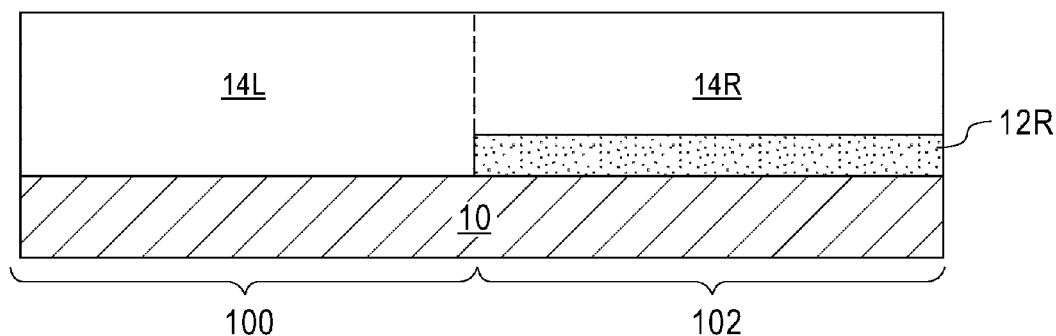
FIG. 3 is a cross sectional view of the exemplary semiconductor structure of FIG. 2 after removing the mask and epitaxially growing a base sacrificial layer of a third semiconductor material, wherein the portion of the base sacrificial layer located on the first substrate and in the first device region has the first crystallographic orientation and the portion of the base sacrificial layer located on a remaining portion of the second substrate and in the second device region has the second crystallographic orientation.

Referring now to FIG. 3, there is illustrated the exemplary semiconductor structure of FIG. 2 after removing the mask 15 and epitaxially growing a base sacrificial layer (14L, 14R) of a third semiconductor material. The base sacrificial layer includes a first portion 14L and a second portion 14R. In accordance with the present application, the first portion 14L of the base sacrificial layer, which is located directly on the first substrate 10 and in the first device region 100, has the first crystallographic orientation, and the second portion 14R of the base sacrificial layer, which is located on the remaining portion of the second substrate (i.e., second substrate portion 12R) and in the second device region 102, has the second crystallographic orientation.

The third semiconductor material that provides the base sacrificial layer (14L, 14R) includes any of the semiconductor materials mentioned above for the first substrate 10 provided that the third semiconductor material is different (i.e., has a different etch selectivity) from either the first and second semiconductor materials. In one example, and when the first and second semiconductor materials are composed of silicon, the third semiconductor material may be composed of a silicon germanium alloy.

Mask 15 may be removed utilizing any mask removal process including, for example, planarization or etching. When an etch is used, the etch is selective in removing the mask 15 from the exemplary semiconductor structure.

The base sacrificial layer (14L, 14R) of the third semiconductor material is formed by an epitaxial growth (or deposition) process. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. Since an epitaxial growth process is used in providing the base sacrificial layer (14L, 14R), the first portion 14L of the base sacrificial layer formed directly from the first substrate 10 has the first crystallographic orientation, while the second portion 14R of the base sacrificial layer formed directly from the second substrate portion 12R has the second crystallographic orientation.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of the base sacrificial layer (14L, 14R), can be performed utilizing any well known precursor gas or gas mixture. Carrier gases like hydrogen, nitrogen, helium and argon can be used.

In some embodiments and as shown, the first portion 14L of the base sacrificial layer that is present in the first device region 100 has a vertical thickness that is greater than a vertical thickness of the second portion 14R of the base sacrificial layer in the second device region 102, yet each portion 14L, 14R of the base sacrificial layer has a topmost surface that is coplanar with each other. In some embodiments, a planarization process such as chemical mechanical polishing and/or grinding can be used to provide the coplanarity to the base sacrificial layer (14L, 14R).

Figure 4:
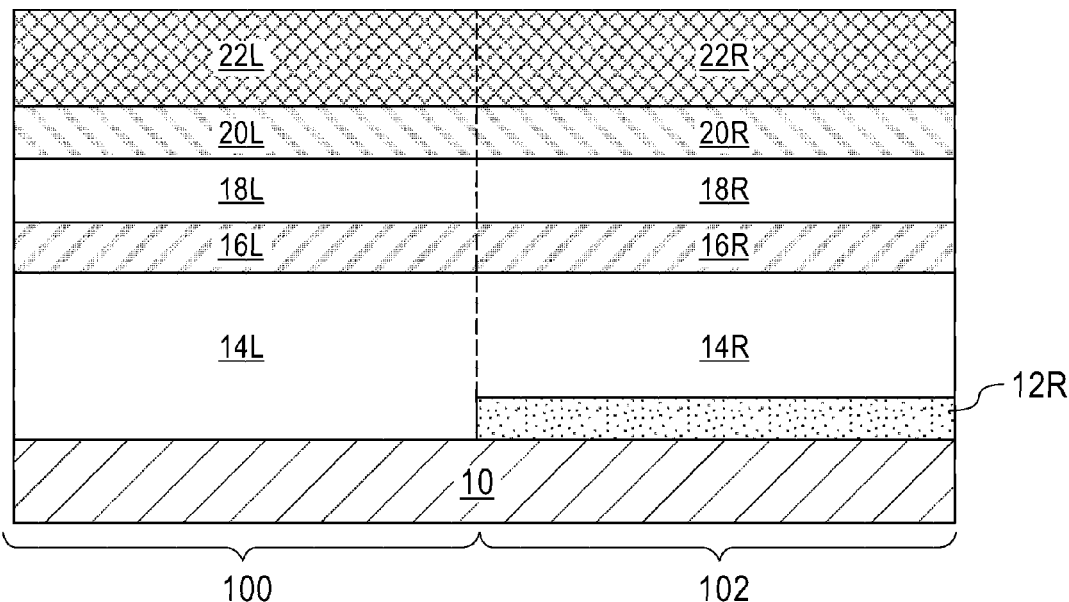
FIG. 4 is a cross sectional view of the exemplary semiconductor structure of FIG. 3 after epitaxially growing a material stack comprising alternating layers of a semiconductor channel material and a sacrificial semiconductor material on the base sacrificial layer, wherein the portion of each layer of semiconductor channel material and each layer of sacrificial semiconductor material located in the first device region has the first crystallographic orientation and the portion of each layer of semiconductor channel material and each layer of sacrificial semiconductor material located in the second device region has the second crystallographic orientation.

Referring now to FIG. 4, there is illustrated the exemplary semiconductor structure of FIG. 3 after epitaxially growing a material stack comprising alternating layers of a semiconductor channel material (e.g., 16L, 16R, 20R, 20L) and a sacrificial semiconductor material (e.g., 18L, 18R, 22L and 22R) on the base sacrificial layer (14L, 14R). The number of layers of semiconductor channel material and the number of layers of sacrificial semiconductor material may vary as long as at least two layers of semiconductor channel material and at least two layers of sacrificial semiconductor material are present. Moreover, and as shown, each layer of semiconductor channel material (e.g., 16L, 16R, 20L, 20R) is capped with a layer of sacrificial semiconductor material (e.g., 18L, 18R, 22L and 22R).

In accordance with the present application, the portion of each layer of semiconductor channel material (e.g., 16L, 20L) and each layer of sacrificial semiconductor material (18L, 22L) located atop the first portion 14L of the base sacrificial layer and in the first device region 100 has the first crystallographic orientation and the portion of each layer of semiconductor channel material (e.g., 16R, 20R) and each layer of sacrificial semiconductor material (e.g., 18R, 22R) located atop the second portion 14R of the base sacrificial layer and in the second device region 102 has the second crystallographic orientation.

Each layer of sacrificial semiconductor material (including, for example, portions 18L, 18R, 22L, 22R) is composed of the third semiconductor material as mentioned above for the base sacrificial layer (14L, 14R). In one example, each layer of sacrificial semiconductor material (including, for example, portions 18L, 18R, 22L, 22R) is composed of a silicon germanium alloy.

Each layer of semiconductor channel material (including for example, portions 16L, 16R, 20L, 20R) is composed of a semiconductor material. The semiconductor material that provides each layer of semiconductor channel material may be the same as, or different from, the first semiconductor material and/or the second semiconductor material with the proviso that the semiconductor material that provides each layer of semiconductor channel material has a different etch rate in a specific etchant as compared to the sacrificial semiconductor material and the base sacrificial layer. In one example, the first and second semiconductor materials and the semiconductor material that provides each layer of semiconductor channel material are each composed of silicon. In some embodiments, each layer of the semiconductor channel material comprises a same semiconductor material. In other embodiments, at least one layer of the semiconductor channel material comprises a different semiconductor material than at least one other layer of semiconductor channel material.

The material stack of alternating layers of semiconductor channel material (e.g., 16L, 16R, 20L, 20R) and sacrificial semiconductor material (e.g., 18L, 18R, 22L, 22R) can be formed utilizing an epitaxial growth (or deposition process) as mentioned above for forming the base sacrificial layer (14L, 14R).

The thickness of each layer of semiconductor channel material may be in a range from 3 nm to 10 nm, while the thickness of each layer of sacrificial semiconductor material may be in a range from 5 nm to 20 nm. Other thicknesses that are lesser than, or greater than, the aforementioned ranges may also be employed in the present application. In some embodiments, each layer of semiconductor channel material has a same thickness. In other embodiments, at least one layer of semiconductor channel material has a different thickness than another layer of semiconductor channel material. In some embodiments, each sacrificial semiconductor material has a same thickness. In other embodiments, at least one layer of sacrificial semiconductor material has a different thickness than another layer of sacrificial semiconductor material.

Figure 5:
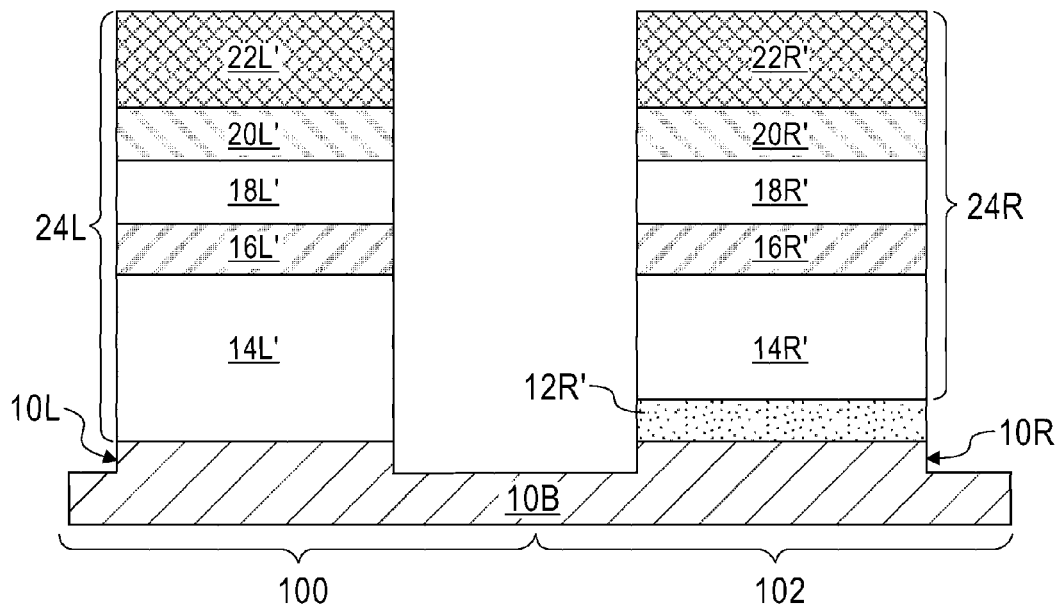
FIG. 5 is a cross sectional view of the exemplary semiconductor structure of FIG. 4 after forming a first nanosheet stack structure in the first device region and a second nanosheet stack structure in the second device region.

Referring now to FIG. 5, there is illustrated the exemplary semiconductor structure of FIG. 4 after forming a first nanosheet stack structure 24L in the first device region 100 and a second nanosheet stack structure 24R in the second device region 102. Although a single first nanosheet structure 24L and a single second nanosheet structure 24R are described and illustrated, the present application contemplates embodiments in which a plurality of first nanosheet structures 24L and/or second nanosheet structures 24R can be formed.

The first nanosheet stack structure 24L includes a remaining portion of the first portion 14L of the base sacrificial layer, and a remaining portion of the material stack including remaining portions of the alternating layers of semiconductor channel material (e.g., 16L, 20L) and of sacrificial semiconductor material (e.g., 18L, 22L). The remaining portion of the first portion 14L of the base sacrificial layer in the first device region 100 is labeled as 14L', the remaining portion of each layer of semiconductor channel material within the first device region 100 is labeled as 16L', 20L' and the remaining portion of each layer of sacrificial semiconductor material within the first device region 100 is labeled as 18L', 22L'. Each semiconductor material that constitutes the first nanosheet structure 24L has the first crystallographic orientation.

The second nanosheet stack structure 24R includes a remaining portion of the second portion 14R of the base sacrificial layer, and a remaining portion of the material stack including remaining portions of the alternating layers of semiconductor channel material (e.g., 16R, 20R) and of sacrificial semiconductor material (e.g., 18R, 22R). The remaining portion of the second portion 14R of the base sacrificial layer in the second device region 102 is labeled as 14R', the remaining portion of each layer of semiconductor channel material within the second device region 102 is labeled as 16R', 20R' and the remaining portion of each layer of sacrificial semiconductor material within the second device region 102 is labeled as 18R', 22R'. Each semiconductor material that constitutes the second nanosheet structure 24R has the second crystallographic orientation.

The first and second nanosheet stack structures 24L, 24R can be formed by patterning the exemplary semiconductor structure shown in FIG. 4. In one embodiment, the patterning process may include lithography and etching as defined above. In one embodiment, and in the first device region 100, the etch removes a portion of the first substrate 10 to provide a first pedestal portion 10L that extends above a remaining portion 10B of the first substrate 10. In one embodiment, and in the second device region 102, the etch also removes a portion of the second substrate portion 12R to provide a second substrate base portion 12R' and a portion of the first substrate 10 to provide a second pedestal portion 10R of the first substrate 10. In accordance with the present application, the first nanosheet stack structure 24L sits on the first pedestal portion 10L of the first substrate 10, while the second nanosheet stack structure 24R sits on the second substrate base portion 12R' and the second pedestal portion 10R of the first substrate 10.

As is shown, the sidewall surfaces of the first nano sheet stack structure 24L are vertically aligned with the sidewall surfaces of the first pedestal portion 10L formed in the first device region 100, while the sidewalls of the second nanosheet stack structure 24R are vertically aligned with the sidewall surfaces of both the second substrate base portion 12R' and the second pedestal portion 10R of the first substrate 10 in the second device region 102. As is further shown, the first nanosheet stack structure 24L is spaced apart and is thus not in direct contact with any portion of the second nanosheet stack structure 24R.

Figure 6:
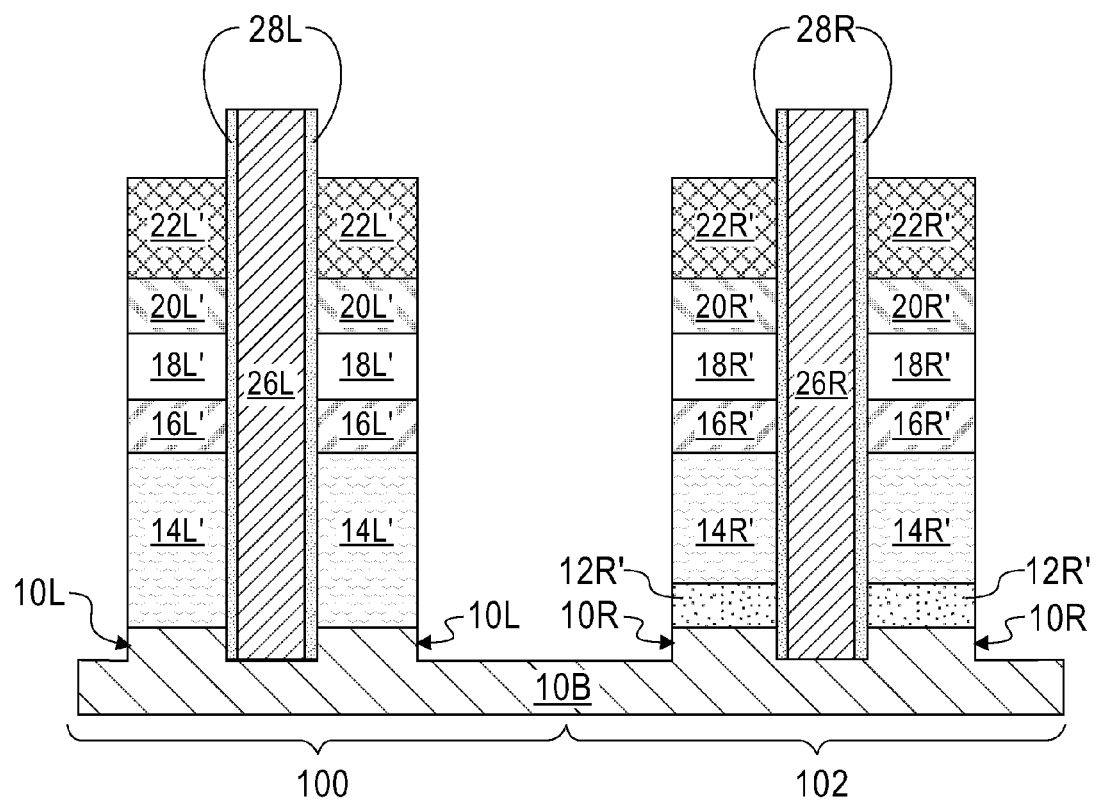
FIG. 6 is a cross sectional view of the exemplary semiconductor structure of FIG. 5 after forming a first sacrificial gate structure and a first dielectric spacer straddling the first nanosheet stack structure and a second sacrificial gate structure and a second dielectric spacer straddling the second nanosheet stack structure.

Referring now to FIG. 6, there is illustrated the exemplary semiconductor structure of FIG. 5 after forming a first sacrificial gate structure 26L and a first dielectric spacer 28L straddling the first nanosheet stack structure 24L and a second sacrificial gate structure 26R and a second dielectric spacer 28R straddling the second nanosheet stack structure 24R. By "straddling" it is meant that a first portion of a first material is located on one side of a second material, and another portion of the first material is located on another side of the second material, and wherein yet a further portion of the first material is present above a topmost surface of the second material. Each sacrificial gate structure 26L, 26R protects a gate region of the exemplary semiconductor structure of the present application during the processing of the source/drain regions of the exemplary semiconductor structure. In the present application, a bottommost surface of the first sacrificial gate structure 26L and a bottommost surface of the first dielectric spacer 28L land on a surface of the remaining portion 10B of the first substrate 10, while a bottommost surface of the second sacrificial gate structure 26R and a bottommost surface of the second dielectric spacer 28R also land on a surface of the remaining portion 10B of the first substrate 10.

Each sacrificial structure 26L, 26R includes a single sacrificial material layer or a stack of two or more sacrificial materials (i.e., at least one sacrificial material portion). In one embodiment, the at least one sacrificial material portion comprises, from bottom to top, a sacrificial gate dielectric portion, a sacrificial gate portion and a sacrificial dielectric cap portion. In some embodiments, the sacrificial gate dielectric portion and/or the sacrificial dielectric cap portion can be omitted and only a sacrificial gate portion is formed. The at least one sacrificial material portion can be formed by forming a blanket layer (or layers) of a material (or various materials) and then patterning the material (or various materials) by lithography and an etch. In one embodiment, the at least one sacrificial material portion can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate portion. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition.

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material can be formed. The sacrificial gate cap material may include a hard mask material such as, for example, silicon dioxide and/or silicon nitride. The sacrificial gate cap material can be formed by any suitable deposition process such as, for example, chemical vapor deposition or plasma enhanced chemical vapor deposition.

After providing the above mentioned sacrificial material stack (or any subset of said sacrificial materials), lithography and etching can be used to pattern the sacrificial material stack (or any subset of said sacrificial materials) and to provide each sacrificial gate structure 26L, 26R. The remaining portions of the sacrificial gate dielectric material constitute a sacrificial gate dielectric portion, the remaining portions of the sacrificial gate material constitute a sacrificial gate portion, and the remaining portions of the sacrificial dielectric cap material constitute a sacrificial dielectric cap portion.

In some embodiments, the first sacrificial gate structure 26L and the second sacrificial gate structure 26R comprise a same sacrificial material or stack of sacrificial materials. In yet another embodiment, the first sacrificial gate structure 26L comprises a different sacrificial material or stack of sacrificial materials from the second sacrificial gate structure 26R. When different materials are used, block mask technology can be implemented during the fabrication of the first and second sacrificial gate structures 26L, 26R.

After providing the first and second sacrificial gate structures (26L, 26R), a dielectric spacer can be formed on exposed sidewall surfaces of the each sacrificial gate structure 26L, 26R. The dielectric spacer that is located on the first sacrificial gate structure 26L is referred to herein a first dielectric spacer 28L, while the dielectric spacer formed on the second sacrificial gate structure 26R is referred to herein as a second dielectric spacer 28R. Each dielectric spacer 28L, 28R can be formed by first providing a dielectric spacer material and then etching the dielectric spacer material. Examples of dielectric spacer materials that may be employed in the present application include dielectric oxides, dielectric nitrides and/or dielectric oxynitrides. In one embodiment, the dielectric spacer material used in providing each dielectric spacer 28L, 28R is composed of silicon dioxide or silicon nitride. The dielectric spacer material may be provided by a deposition process including, for example, chemical vapor deposition (CVD), plasma enhanced chemical vapor deposition (PECVD), or physical vapor deposition (PVP). The etch used to provide the dielectric spacer may comprise a dry etching process such as, for example, reactive ion etching.

Figure 7:
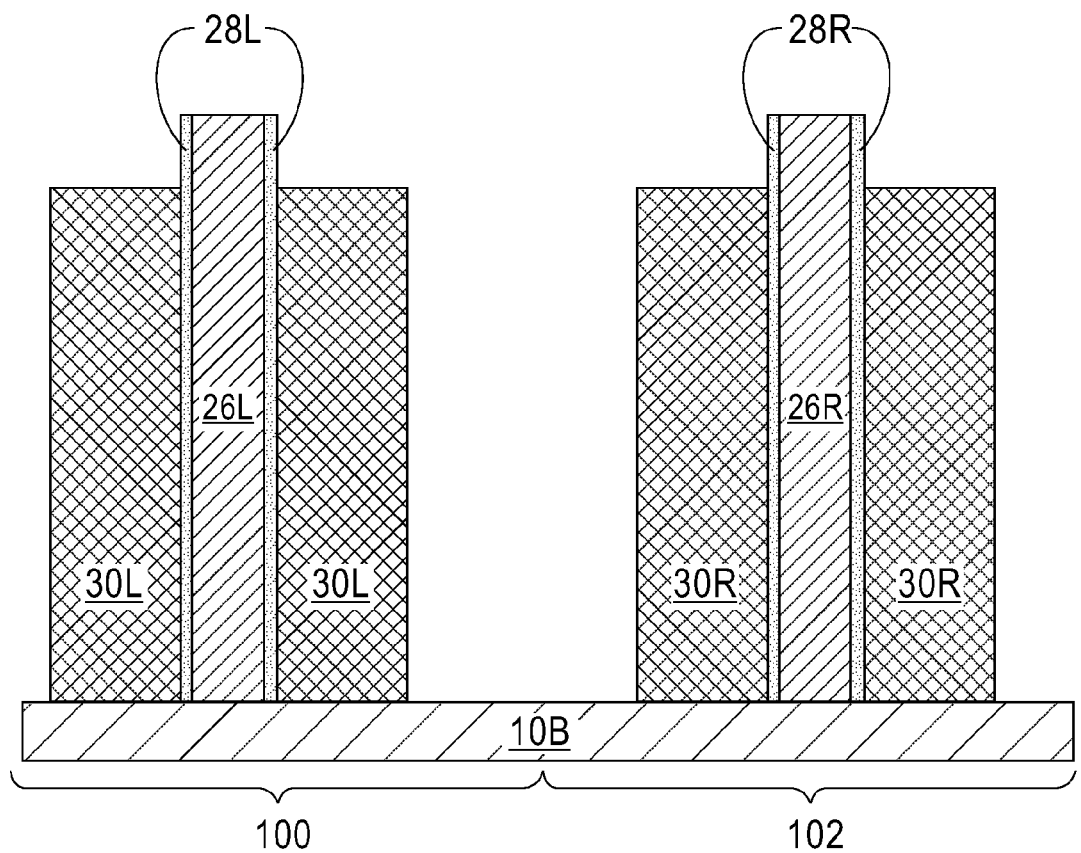
FIG. 7 is a cross sectional view of the exemplary semiconductor structure of FIG. 6 after removing exposed portions of the first and second nanosheet stack structures and forming a first epitaxial semiconductor S/D structure in the first device region and a second epitaxial semiconductor S/D structure in the second device region.

Referring now to FIG. 7, there is illustrated the exemplary semiconductor structure of FIG. 6 after removing exposed portions of the first and second nanosheet stack structures 24L, 24R (not covered by either a sacrificial gate structure or a dielectric spacer) and forming a first epitaxial semiconductor S/D ("S/D" denotes source/drain) structure 30L in the first device region 100 and a second epitaxial semiconductor S/D structure 30R in the second device region 102.

The exposed portions of the first and second nanosheet stack structures 24L, 24R can be removed utilizing an anisotropic etching process such as for example, a reactive ion etch, utilizing each sacrificial gate structure and each dielectric spacer as an etch mask. Although not shown, a portion of the first nanosheet stack structure 24L remains beneath the first sacrificial gate structure 26L and the first dielectric spacer 28L, and a portion of the second nanosheet stack structure 24R remains beneath the second sacrificial gate structure 26R and the second dielectric spacer 28L.

Each first epitaxial semiconductor S/D structure 30L grows from an exposed sidewall surface of the remaining first nanosheet stack structure in the first device region 100, while each second epitaxial semiconductor S/D structure 30R grows from an exposed sidewall surface of the remaining second nanosheet stack structure in the second device region 102. The forming of the first epitaxial semiconductor S/D structure 30L in the first device region 100 and the second epitaxial semiconductor S/D structure 30R in the second device region 102 includes an epitaxial growth process as defined above.

Each first epitaxial semiconductor S/D structure 30L and each second epitaxial semiconductor S/D structure 30R includes a semiconductor material and a dopant. The dopant within the each first epitaxial semiconductor S/D structure 30L is of a different conductivity than the dopant within each second epitaxial semiconductor S/D structure 30R.

The semiconductor material that provides each first epitaxial semiconductor S/D structure 30L and each second epitaxial semiconductor S/D structure 30R can be selected from one of the semiconductor materials mentioned above for the first substrate 10. The dopant can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one embodiment, the dopant that can be present in the each first epitaxial semiconductor S/D structure 30L and each second epitaxial semiconductor S/D structure 30R can be introduced into the precursor gas that provides the first epitaxial semiconductor S/D structure 30L and each second epitaxial semiconductor S/D structure 30R. In another embodiment, the dopant can be introduced into an intrinsic layer of each first epitaxial semiconductor S/D structure 30L and each second epitaxial semiconductor S/D structure 30R by utilizing one of ion implantation or gas phase doping. Block mask technology may be used to form each first epitaxial semiconductor S/D structure 30L and each second epitaxial semiconductor S/D structure 30R.

Each first epitaxial semiconductor S/D structure 30L has a height that is less than the first sacrificial gate structure 26L and each second epitaxial semiconductor S/D structure 30R has a height that is less than the height of the second sacrificial gate structure 26R.

Figure 8:
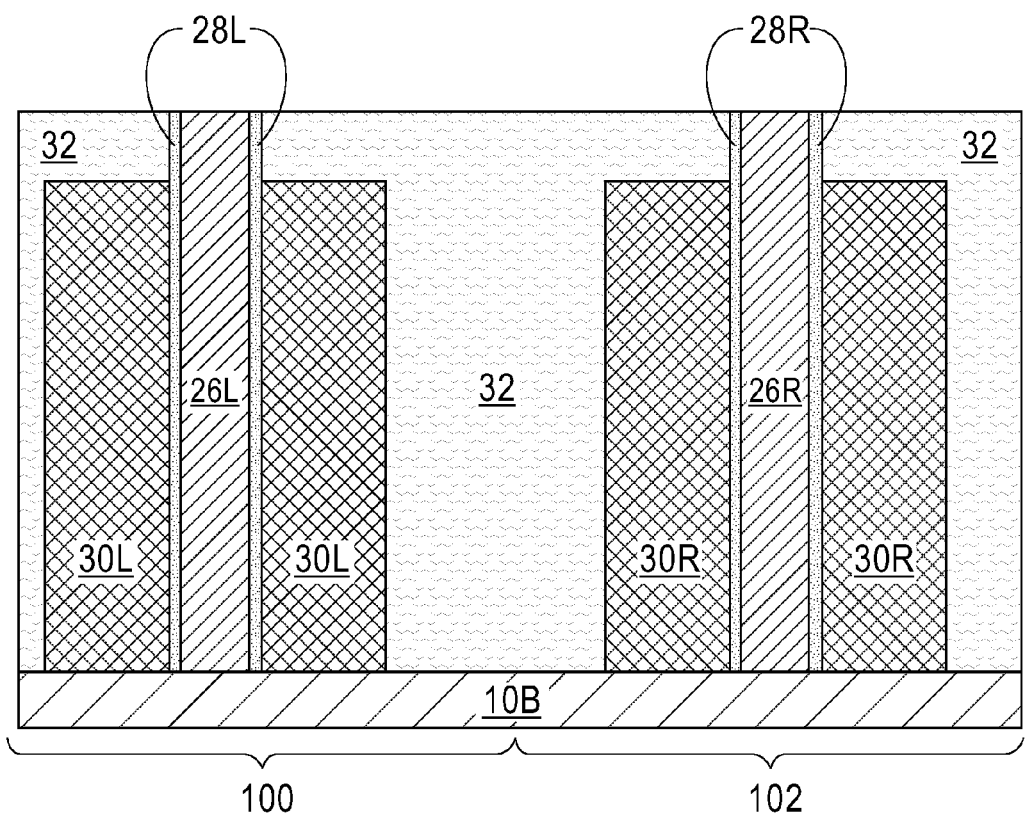
FIG. 8 is a cross sectional view of the exemplary semiconductor structure of FIG. 7 after forming a middle-of-the-line (MOL) dielectric material structure having a topmost surface that is coplanar with a topmost surface of each of the first and second sacrificial gate structures.

Referring now to FIG. 8, there is illustrated the exemplary semiconductor structure of FIG. 7 after forming a middle-of-the-line (MOL) dielectric material structure 32 having a topmost surface that is coplanar with a topmost surface of each of the first and second sacrificial gate structures 26L, 26R.

MOL dielectric material structure 32 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as MOL dielectric material structure 32. The use of a self-planarizing dielectric material as MOL dielectric material structure 32 may avoid the need to perform a subsequent planarizing step.

In one embodiment, the MOL dielectric material structure 32 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as MOL dielectric material structure 32, a planarization process or an etch back process follows the deposition of the dielectric material that provides the MOL dielectric material structure 32. The thickness of the dielectric material that provides the MOL dielectric material structure 32 may vary depending on the type of dielectric material employed as well as the method that was employed in forming the same. In one embodiment, the dielectric material used to provide the MOL dielectric material structure 32 has a thickness from 80 nm to 500 nm. Other thicknesses that are greater or lesser than the range provided above can also be used for the dielectric material that provides the MOL dielectric material structure 32.

Figure 9:
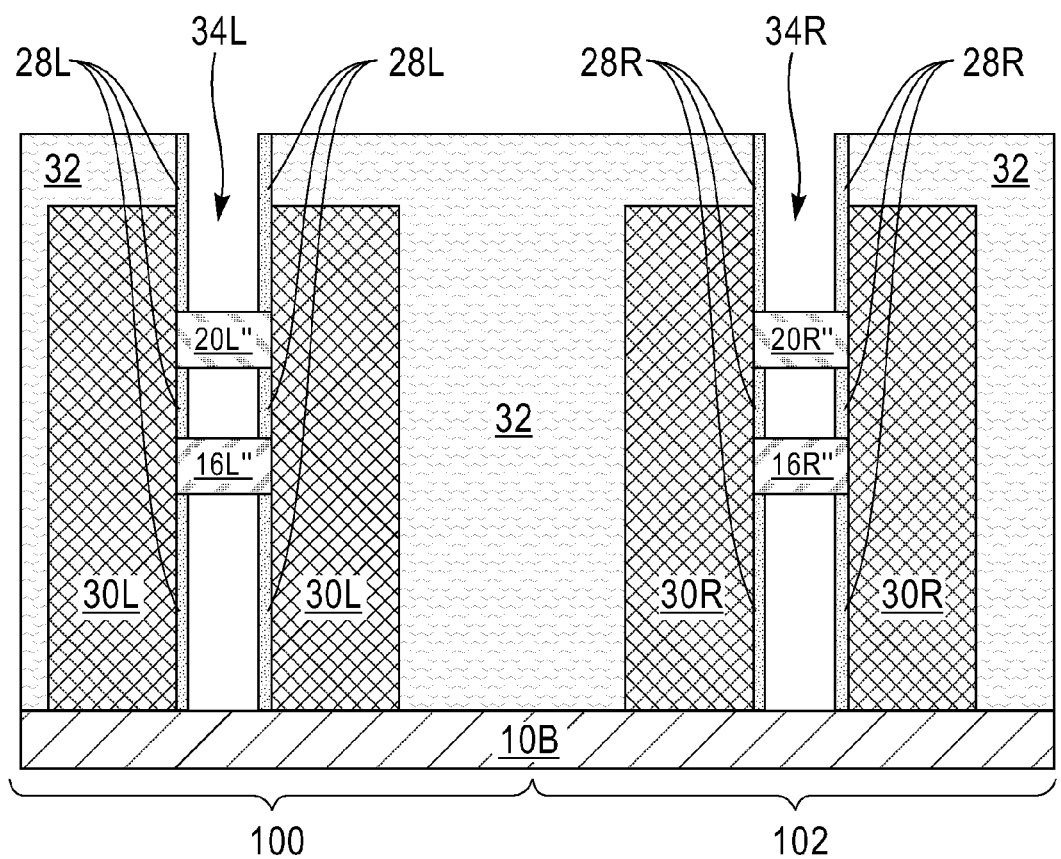
FIG. 9 is a cross sectional view of the exemplary semiconductor structure of FIG. 8 after removing the first and second sacrificial gate structures and thereafter selectively removing remaining portions of the base sacrificial layer and remaining portions of the layers of sacrificial semiconductor material within the first and second device regions to provide vertically stacked and suspended nanosheets of semiconductor channel material within the first and second device regions.

Referring now to FIG. 9, there is illustrated the exemplary semiconductor structure of FIG. 8 after removing the first and second sacrificial gate structures 26L, 26R and thereafter selectively removing remaining portions of the base sacrificial layer 14L', 14R' and remaining portions of the layers of sacrificial semiconductor material (18L', 18R', 22L' and 22R') within the first and second device regions 100, 102 to provide vertically stacked and suspended nanosheets (e.g., 16L" and 20L", and 16R" and 20R") of semiconductor channel material within the first and second device regions 100, 102. As is shown, a first gate cavity 34L is formed in the first device region 100, and a second gate cavity 34R is formed in the second device region 102. Although not shown (for clarity), a portion of the first dielectric spacer 28L and a portion of the second dielectric spacer 28L would be located in front of the vertically stacked and suspended nanosheets (e.g., 16L" and 20L", and 16R" and 20R") of semiconductor channel material within the first and second device regions 100, 102, respectively. Each nanosheet (e.g., 16L" and 20L", and 16R" and 20R") of semiconductor channel material has a width from 10 nm to 60 nm. The vertical thickness of each nanosheet is less than the width of each nanosheet.

The removal of the first and second sacrificial gate structures 26L, 26R can be performed utilizing one or more anisotropic etching processes. The removal of remaining portions of the base sacrificial layer 14L', 14R' and remaining portions of the layers of sacrificial semiconductor material (18L', 18R', 22L' and 22R') within the first and second device regions 100, 102 can be performed utilizing a wet etch process that is selective in removing the sacrificial semiconductor material relative to the semiconductor channel material.

In the present embodiment, the vertically stacked and suspended nanosheets (e.g., 16L" and 20L", and 16R" and 20R") of semiconductor channel material within the first and second device regions 100, 102 are located above the remaining portion 10B of the first substrate 10.

Notably, FIG. 9 illustrates a semiconductor structure of the present application which includes a substrate (i.e., remaining portion 10B of first substrate 10) comprising a first semiconductor material and having a first crystallographic orientation and a first device region 100 and a second device region 102. First vertically stacked and suspended nanosheets of semiconductor channel material (i.e., 16L", 20L", etc) of the first crystallographic orientation are located above the substrate (i.e., 10B) and within the first device region 100. Second vertically stacked and suspended nanosheets of semiconductor channel material (i.e., 16R", 20R", etc.) of a second crystallographic orientation are located above the substrate (i.e., 10B) and within the second device region 102. In accordance with the present application, the second crystallographic orientation is different from the first crystallographic orientation. In one embodiment, the first vertically stacked and suspended nanosheets of semiconductor channel material (i.e., 16L", 20L", etc) and the second vertically stacked and suspended nanosheets of semiconductor channel material (i.e., 16R", 20R", etc) are each comprised of relaxed semiconductor materials. In other embodiments, the first vertically stacked and suspended nanosheets of semiconductor channel material (i.e., 16L", 20L", etc) is comprised of a relaxed (or strained) semiconductor materials, while the second vertically stacked and suspended nanosheets of semiconductor channel material (i.e., 16R", 20R", etc) is comprised of strained (or relaxed) semiconductor materials.

Figure 10:
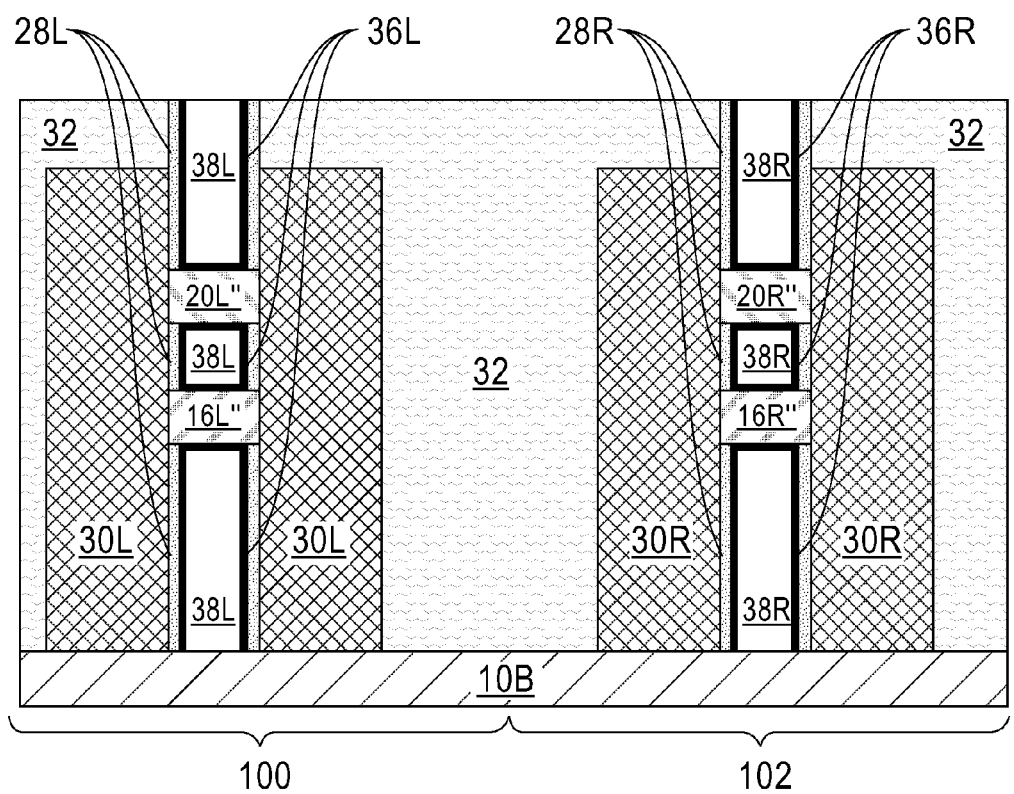
FIG. 10 is a cross sectional view of the exemplary semiconductor structure of FIG. 9 after forming a first functional gate structure surrounding the vertically stacked and suspended nanosheets of the semiconductor channel material within the first device region, and a second functional gate structure surrounding the vertically stacked and suspended nanosheets of the semiconductor channel material within the second device region.

Referring now to FIG. 10, there is illustrated the exemplary semiconductor structure of FIG. 9 after forming a first functional gate structure (36L, 38L) surrounding the first vertically stacked and suspended nanosheets (16L" and 20L") of the semiconductor channel material within the first device region 100, and a second functional gate structure (36R, 38R) surrounding the second vertically stacked and suspended nanosheets (16R" and 20R") of the semiconductor channel material within the second device region 102. By "functional gate structure" it is meant a permanent gate structure used to control output current (i.e., flow of carriers in the channel) of a semiconducting device through electrical or magnetic fields.

The first functional gate structure (36L, 38L) includes a first gate dielectric portion 36L and a first gate conductor portion 38L, while the second functional gate structure (36R, 38R) includes a second gate dielectric portion 36R and a second gate conductor portion 38R. In one embodiment, the first functional gate structure (36L, 38L) is a pFET device that is located on the first vertically stacked and suspended nanosheets (16L" and 20L") of the semiconductor channel material that have a {110} crystallographic orientation, while the second functional gate structure (36R, 38R) is an nFET device that is located on the second vertically stacked and suspended nanosheets (16R" and 20R") of the semiconductor channel material that have a {100} crystallographic orientation. In such an embodiment, each semiconductor channel material that has a {100} crystallographic orientation may be strained (e.g., strained Si). Also, each semiconductor channel material that has a {110} crystallographic orientation may be relaxed (e.g., relaxed Si).

Each gate dielectric portion (36L, 36R) may include a gate dielectric material. The gate dielectric material that provides each gate dielectric portion (36L, 36R) can be an oxide, nitride, and/or oxynitride. In one example, the gate dielectric material that provides each gate dielectric portion (36L, 36R) can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as each gate dielectric portion (36L, 36R). The first gate dielectric portion 36L may be the same as, or different from, the second gate dielectric portion 36R.

The gate dielectric material used in providing the gate dielectric portion (36L, 36R) can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions (36L, 36R), block mask technology can be used. In one embodiment of the present application, the gate dielectric material used in providing each gate dielectric portion (36L, 36R) can have a thickness in a range from 1 nm to 10 nm. Other thicknesses that are lesser than, or greater than, the aforementioned thickness range can also be employed for the gate dielectric material that may provide each gate dielectric portion (36L, 36R).

Each gate conductor portion (38L, 38R) can include a gate conductor material. The gate conductor material used in providing each gate conductor portion (38L, 38R) can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. The first gate conductor portion 38L may be the same as, or different from, the second gate conductor portion 38R. In one example, the first gate conductor portion 38L may comprise an nFET gate metal, while the second gate conductor portion 38R may comprise a pFET gate metal. In another example, the first gate conductor portion 38L may comprise a pFET gate metal, while the second gate conductor portion 38R may comprise an nFET gate metal.

The gate conductor material used in providing the gate conductor portion (38L, 38R) can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for gate conductor portions (38L, 38R), block mask technology can be used. In one embodiment, the gate conductor material used in providing each gate conductor portion (38L, 38R) has a thickness from 50 nm to 200 nm. Other thicknesses that are lesser than, or greater than, the aforementioned thickness range can also be employed for the gate conductor material used in providing each gate conductor portion (38L, 38R).

Each functional gate structure can be formed by providing a functional gate material stack of the gate dielectric material, and the gate conductor material. A planarization process may follow the formation of the functional gate material stack. Block mask technology may be used to selectively provide one of the functional gate structures prior to forming the other functional gate structure. As is shown, the middle-of-the-line (MOL) dielectric material 32 surrounds the first functional gate structure and the second functional gate structure, and a topmost surface of the MOL dielectric material 32 is coplanar with a topmost surface of the first and second functional gate structures.

Figure 11:
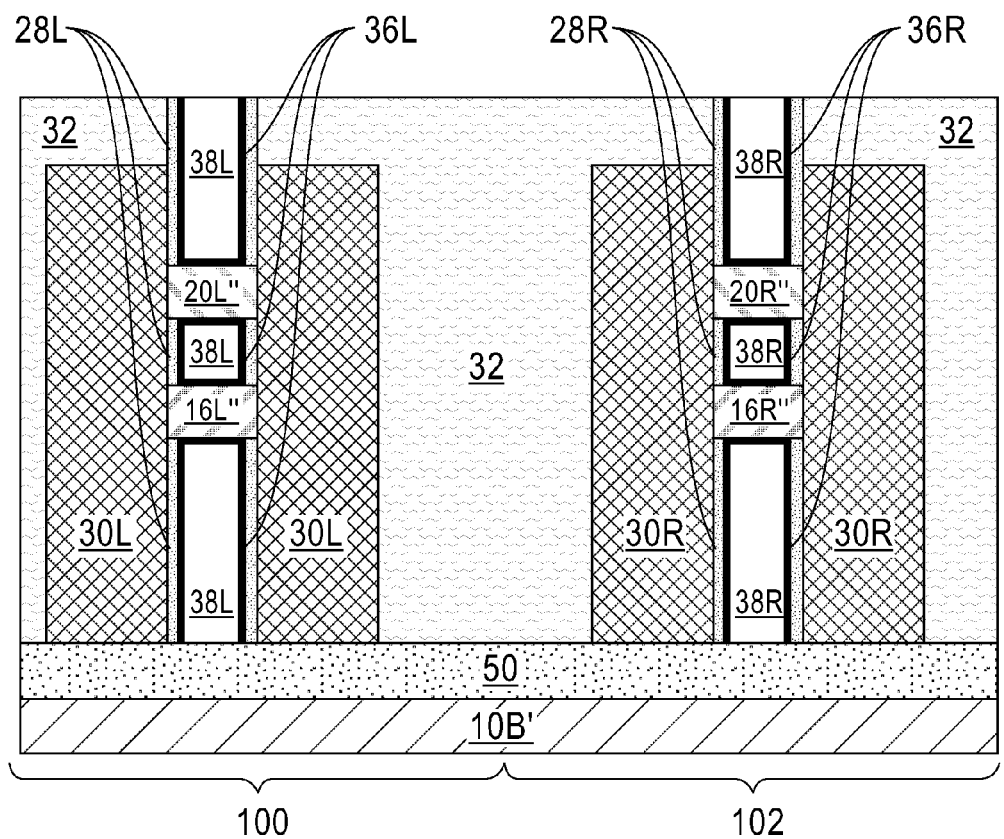
FIG. 11 is a cross sectional view of another exemplary semiconductor structure of the present application.

Referring now to FIG. 11, there is illustrated another exemplary semiconductor structure of the present application. The exemplary semiconductor structure of FIG. 11 can be formed utilizing the basic processing steps described and illustrated above with respect to FIGS. 1-10 except that an undercut process is performed in the sacrificial base layer (14L, 14R) and filling the same with an insulator (e.g., an oxide) to provide an insulator layer 50.

Figure 12:
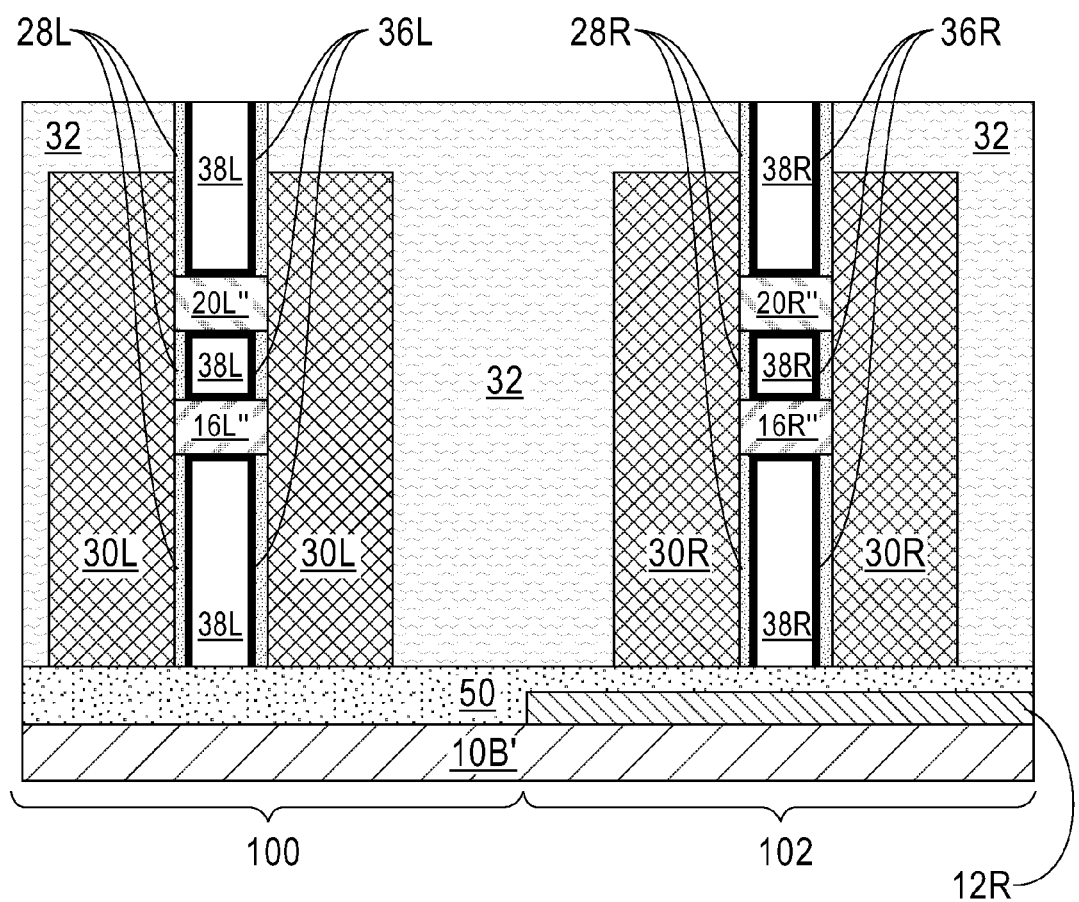
FIG. 12 is a cross sectional view of yet another exemplary semiconductor structure of the present application.

Referring now to FIG. 12, there is illustrated yet another exemplary semiconductor structure of the present application. The exemplary semiconductor structure of FIG. 12 can be formed utilizing the basic processing steps described and illustrated above with respect to FIGS. 1-10 except that an undercut process is performed in the sacrificial base layer (14L, 14R) between FIGS. 5 and 6 of the present application, and thereafter filling the same with an insulator (e.g., oxide) to provide an insulator layer 50.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
    a substrate comprising a first semiconductor material having a first crystallographic orientation and a first device region and a second device region;
    first vertically stacked and suspended nanosheets of a semiconductor channel material of said first crystallographic orientation located above said substrate and within said first device region; and
    second vertically stacked and suspended nanosheets of a semiconductor channel material of a second crystallographic orientation located above said substrate and within said second device region, wherein said second crystallographic orientation is different from said first crystallographic orientation.

2. The semiconductor structure of claim 1, further comprising a first epitaxial semiconductor S/D structure located on sidewall surfaces of said first vertically stacked and suspended nanosheets of said semiconductor channel material of said first crystallographic orientation, and a second epitaxial semiconductor S/D structure located on sidewall surfaces of said second vertically stacked and suspended nanosheets of said semiconductor channel material of said second crystallographic orientation.

3. The semiconductor structure of claim 2, wherein said first epitaxial semiconductor S/D structure and said second epitaxial semiconductor S/D structure comprises a semiconductor material and a dopant selected from the group consisting of an n-type dopant or a p-type dopant.

4. The semiconductor structure of claim 3, wherein said dopant of said first epitaxial semiconductor S/D structure is of a different conductivity type than said dopant of said second epitaxial semiconductor S/D structure.

5. The semiconductor structure of claim 1, wherein each semiconductor channel material of said first vertically stacked and suspended nanosheets of said semiconductor channel material and said second vertically stacked and suspended nanosheets of said semiconductor channel material is composed of silicon.

6. The semiconductor structure of claim 5, wherein said first crystallographic orientation is {100} and said second crystallographic orientation is {110}.

7. The semiconductor structure of claim 5, wherein said first crystallographic orientation is {110} and said second crystallographic orientation is {100}.

8. The semiconductor structure of claim 1, further comprising an insulator layer located directly on an entirety of said substrate in said first and second device regions.

9. The semiconductor structure of claim 1, further comprising an insulator layer located directly on said substrate in said first device region, and a substrate portion of a second semiconductor material having said second crystallographic orientation that is present on said substrate in said second device region, wherein a portion of said oxide layer extends onto said substrate portion.

10. The semiconductor structure of claim 1, further comprising a first functional gate structure surrounding said first vertically stacked and suspended nanosheets of said semiconductor channel material and a second functional gate structure surrounding said second vertically stacked and suspended nanosheets of said semiconductor channel material.

11. The semiconductor structure of claim 10, wherein said first functional gate structure is a pFET and said second functional gate structure is a nFET.

12. The semiconductor structure of claim 11, wherein said first crystallographic orientation is {110} and said second crystallographic orientation is {100}, and wherein each semiconductor channel material of said first vertically stacked and suspended nanosheets of said semiconductor channel material comprises a relaxed semiconductor material, and each semiconductor channel material of said second vertically stacked and suspended nanosheets of said semiconductor channel material comprises a strained semiconductor material.

13. The semiconductor structure of claim 10, further comprising a middle-of-the-line (MOL) dielectric material surrounding said first functional gate structure and said second functional gate structure, wherein a topmost surface of said MOL dielectric is coplanar with a topmost surface of said first and second functional gate structures.

14. The semiconductor structure of claim 13, wherein a topmost surface of said first and second vertically stacked and suspended nanosheets of said semiconductor channel materials is located beneath said topmost surface of said MOL dielectric material.

15. The semiconductor structure of claim 1, wherein each semiconductor channel material of said first and second vertically stacked and suspended nanosheets of said semiconductor channel material comprises a same semiconductor material.

16. The semiconductor structure of claim 1, wherein at least one semiconductor channel material of said first and second vertically stacked and suspended nanosheets of said semiconductor channel materials comprises a different semiconductor material than at least one other semiconductor channel material.

17. The semiconductor structure of claim 1, wherein each semiconductor channel material of said first vertically stacked and suspended nanosheets of said semiconductor channel material is comprised of a relaxed semiconductor material, and each semiconductor channel material of said second vertically stacked and suspended nanosheets of said semiconductor channel material is comprised of a strained semiconductor material.

18. The semiconductor structure of claim 1, wherein each semiconductor channel material of said first vertically stacked and suspended nanosheets of said semiconductor channel material is comprised of a strained semiconductor material, and each semiconductor channel material of said second vertically stacked and suspended nanosheets of said semiconductor channel material is comprised of a relaxed semiconductor material.

* * * * *